United States Patent [19]

Awano

[11] Patent Number: 4,916,495
[45] Date of Patent: Apr. 10, 1990

[54] SEMICONDUCTOR DEVICE WITH SEMI-METAL

[75] Inventor: Yuji Awano, Tokyo, Japan

[73] Assignee: Fujitsu Limited, Kawasaki, Japan

[21] Appl. No.: 289,031

[22] Filed: Dec. 23, 1988

[30] Foreign Application Priority Data

Dec. 26, 1987 [JP] Japan .................................. 62-328285

[51] Int. Cl.$^4$ .......................................... H01L 29/161
[52] U.S. Cl. .......................................... 357/16; 357/4; 357/12; 357/15; 357/61
[58] Field of Search ...................... 357/4, 12, 15, 16, 61

[56] References Cited

PUBLICATIONS

App. Phys. Lett. 35(12) Dec. 15, 1979, 1980 American Institute of Physics, "Observation of Semiconductor-Semimetal Transition in InAs-GaSb Superlattices", L. L. Chang et al, pp. 939-942.
Solid-State Electronics, Pergamon Press 1966, vol. 9, "Appraisal of Semiconductor-Metal-Semiconductor Transistor", S. M. Sze et al., pp. 751-769.
International Electron Device Meeting, 1980 IEEE, "Tunneling Hot Electron Transfer Amplifiers (Theta): A Proposal for Novel Amplifiers Operating in the Subpicosecond Range", by Mordehai Heiblum, pp. 629-632.
Physical Review B, vol. 18, No. 6, Sep. 15, 1978, 1978 The American Physical Society, "InAs-GaSb Superlattice Energy Structure and Its Semiconductor-Semimetal Transition", by G. A. Sai-Halasz et al., pp. 2812-2818.

Primary Examiner—Edward J. Wojciechowicz
Attorney, Agent, or Firm—Staas & Halsey

[57] ABSTRACT

A semiconductor device having a high switching speed and high current gain in the microwave region. A semimetal base transistor is provided to reduce the energy difference between the conduction band edge of a base layer and the valance band edge of an emitter layer or a collector layer, and to reduce the base resistance.

22 Claims, 14 Drawing Sheets

# SEMICONDUCTOR DEVICE WITH SEMI-METAL

BACKGROUND OF THE INVENTION

1. Field of the Invention

The present invention relates to a semiconductor device with a semi-metal having superior characteristics such as a high switching speed, high current gain in the microwave region, and so forth.

2. Description of the Related Art

In general, electrons having a high energy, e.g., an energy level higher than the Fermi energy by 2 to 3 kT (k: Boltsman constant, T: lattice temperature), are referred to as hot electrons. Several semiconductor devices are known in which hot electrons are used for transportation between one terminal and the other terminal in a three-terminal transistor similar to the bipolar transistor.

In such semiconductor devices, only the metal base transistor (MBT) (see, for example, S. M. Sze and H. K. Gummel "Appraisal of Semiconductor-Metal-Semiconductor Transistors," Solid State Electronics, vol. 9, p. 751 (1966)) having superior microwave characteristics with a high current gain is known.

In the MBT, however, since the Schottky barrier between the semiconductor emitter or collector and the metal base is too high, the reflection factor of the carriers at the interface between the semiconductor layer and the metal layer is large. Therefore, the injection efficiency from the emitter to the base is low.

Further, in the metal base layer, the injected carriers are scattered by the electrons so that a considerable amount of energy of the carriers is lost in the base layer. This result in a large base current and small current amplification factor.

In a semiconductor device in which the above-mentioned first drawback of the MBT is eliminated, a hot-electron transistor (HET) is known "Tunneling Hot Electron Transfer Amplifiers (THETA): A Proposal for Novel Amplifiers Operating in the Subpicosecond Range", M. Heiblum, International Electron Device Meeting, p. 629 (1980).

In the HET, a high density n-type semiconductor is used as base material so that the potential barrier between the emitter or the collector and the base is smaller than that in the MBT. The HET, however, has a drawback of a larger base resistance than the MBT, which causes a lowering of the maximum oscillating frequency. To lower the maximum oscillating frequency in the HET, the base length can be elongated. The long base length, however, also lowers the maximum oscillating frequency, and therefore, it is not preferable in the HET to elongate the base length to lower the base resistance.

Apart from the above-mentioned MBT or HET, Japanese Unexamined Patent Publication No. 62-45064, published on Feb. 27, 1987, discloses a four-terminal heterojunction semiconductor device of. In this device, a semi-metal is realized only when a bias voltage is applied to the device.

Further, a semiconductor-semimetal transistor in InAs-GaSb superlattices is mentioned in a paper of Appl. Phys. Lett. 35 (12), 15 December, 1979, 0003-6951/79/240939, pp. 939–942. In this paper, it is disclosed that a semi-metal state is realized in a GaSb-InAs superlattice when the InAs layer thickness is between 100 Å and 200 Å.

SUMMARY OF THE INVENTION

In view of the above-mentioned prior art, an object of the present invention is to provide a semiconductor device with a semi-metal base having a smaller base length and lower base resistance, so that the frequency characteristic in the high frequency range is improved.

According to the present invention, there is provided a semiconductor device comprising a first semiconductor layer, a second semiconductor layer, a third semiconductor layer sandwiched between the first and second semiconductor layers, a first electrode in ohmic contact with the first semiconductor layer, a second electrode in ohmic contact with the second semiconductor layer, and a third electrode in ohmic contact with at least the third semiconductor layer.

The first and second semiconductor layers have substantially the same conduction bands and have substantially the same valence bands when a bias voltage is not applied thereto. At the interfaces between the first and third semiconductor layers and between the second and third semiconductor layers, the energy level of the conduction band edge of the third semiconductor layer is lower than the energy level of the valence band edge of the first or second semiconductor layer.

The third semiconductor layer has a thickness sufficiently thin that, at least at the interfaces between the first and third semiconductor layers and between the second and third semiconductor layers, a semi-metal layer is formed.

In the above-described semiconductor device according to the present invention, a three-terminal device having a semi-metal layer is obtained in which a high switching speed, low reflection factor in quantum mechanics, and small base resistance are realized.

BRIEF DESCRIPTION OF THE DRAWINGS

FIG. 2(A) is an energy-band diagram of the state when a voltage is applied to the MBT shown in FIG. 2(B) which corresponds to the MBT shown in FIG. 1(A);

FIG. 3(A) is an energy-band diagram of the state when a voltage is applied to a conventional HET shown in FIG. 3(B);

FIG. 7(A) is an energy-band diagram for explaining the principle of the present invention shown in FIG. 7(B);

FIG. 14(A) is an energy-band diagram of the embodiment shown in 13 as shown in FIG. 14(B);

FIG. 16(A) is an energy-band diagram of the embodiment shown in 15 as shown in FIG. 16(B);

DESCRIPTION OF THE PREFERRED EMBODIMENTS

For a better understanding of the present invention, the prior art and problems therewith will be described with reference to FIGS. 1 to 6.

Figure 1A:
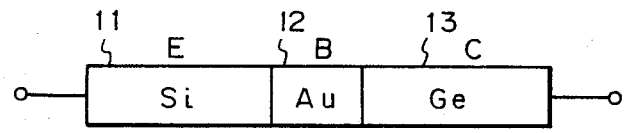
FIGS. 1(A) and 1(B) are a main-portion cut side view of a conventional MBT and a corresponding energy-band diagram of the MBT.
Figure 1B:
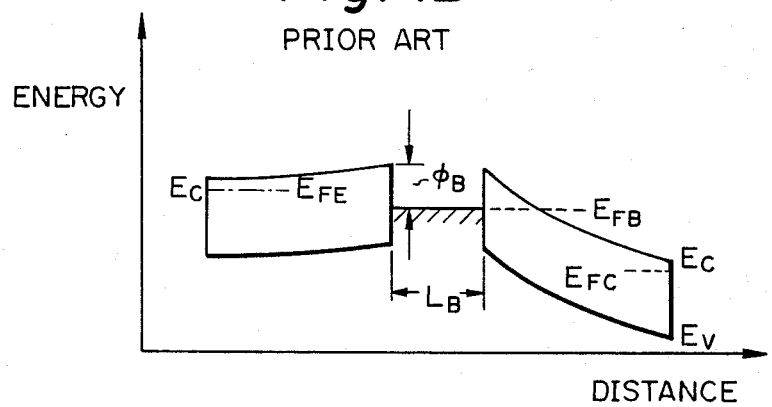

FIG. 1 is a main-portion cut side view of a conventional MBT and a corresponding energy-band diagram of the MBT (S. M. Sze and H. K. Gummel "Appraisal of Semiconductor-Metal-Semiconductor Transistors," Solid State Electronics, vol. 9, p. 751 (1966)).

In FIG. 1, 11 represents an emitter layer (E) consisting of Si, 12 represents a base layer (B) consisting of Au, and 13 represents a collector layer (C) consisting of Ge, respectively.

The horizontal axis in the band diagram represents the distance, and the vertical axis represents the energy. $E_C$ represents the bottom of the conduction band, $E_V$ the top of the valence band, $E_G$ the energy gap, $\phi_B$ the Schottky barrier height, and $L_B$ the length (here, 90 Å) of the base layer 12.

The above-mentioned MBT has, as found by experiment, a common base current gain $\alpha_0$ of only about 0.3, which is very low. The reasons for this are as follows.

Figure 2A:
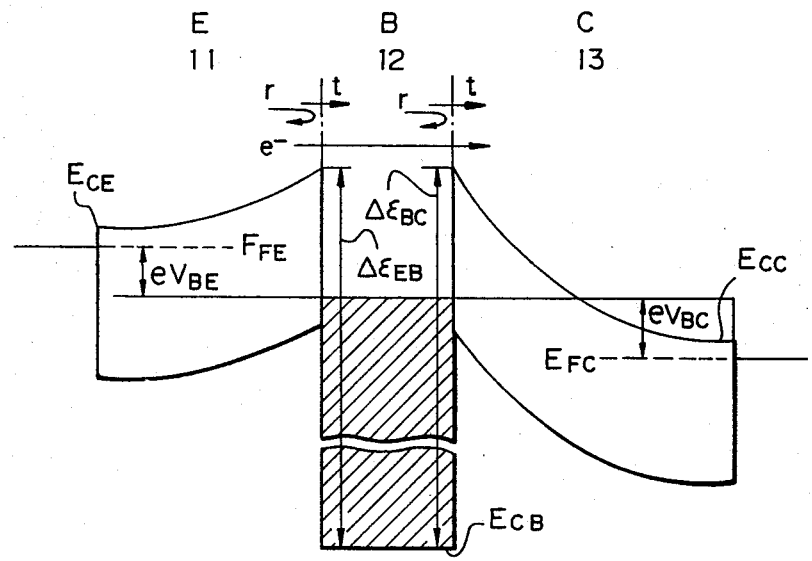
FIGS. 2(A) and (B)
Figure 2B:
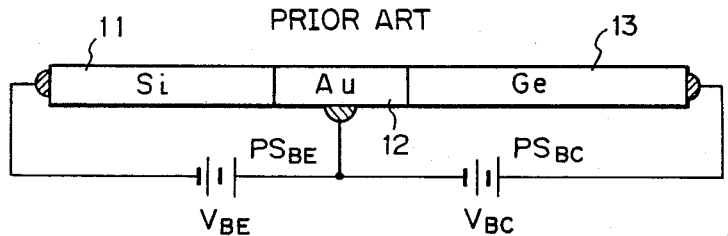

FIG. 2 is an energy-band diagram when a base-emitter voltage $V_{BE}$ is applied between the base and the emitter and a base-collector voltage $V_{BC}$ is applied between the base and the collector, in which the same symbols as used in FIG. 1 represent the same parts.

In FIG. 2, $E_{CE}$ represents the bottom of the conduction band in the emitter layer, $E_{CB}$ the bottom of the conduction band in the base layer, $E_{CC}$ the bottom of the conduction band in the collector layer, $eV_{BE}$ the Fermi-level difference between the emitter layer and the base layer produced by the base-emitter voltage $V_{BE}$, $eV_{BC}$ the Fermi-level difference between the base layer and the collector layer produced by the base-collector voltage $V_{BC}$, $\Delta\epsilon_{EB}$ the energy difference at the interface between the emitter layer and the base layer, between the bottom $E_{CE}$ of the conduction band in the emitter layer and the bottom $E_{CB}$ of the conduction band in the base layer, $\Delta\epsilon_{BC}$ the energy difference at the interface between the base layer and the collector layer, between the bottom $E_{CB}$ of the conduction band in the base layer and the bottom $E_{CC}$ of the conduction band in the collector layer, $PS_{BE}$ a power supply for generating the voltage $V_{BE}$ applied between the base and the emitter, $PS_{BC}$ a power supply for generating the voltage $V_{BC}$ applied between the base and the collector, and $e^-$ an electron, respectively.

The current gain $\alpha_0$ is $i_c/i_e$, i.e., the ratio of the electrons $e^-$ injected from the emitter layer 11 to the electrons reaching the collector layer 13. When all of the electrons $e^-$ reach the collector layer 13. $\alpha_0=1$. In the MBT, the current gain $\alpha_0$ is very small. There are two major reasons for the small current gain $\alpha_0$ in the MBT. First, when the electrons $e^-$ are injected from the emitter layer 11 to the base layer 12, the energy of the electrons $e^-$ is greatly increased, as illustrated in the figure by $\Delta\epsilon$. This is due to the very large energy difference $\Delta\epsilon_{EB}$ between the bottom $E_{CE}$ of the conduction band in the emitter region 11 and the bottom $E_{CB}$ of the conduction band in the base region 12, at the interface therebetween. Such a sharp and large potential difference causes the electrons $e^-$ to be reflected quantum-mechanically so that the amount of the electrons $e^-$ which cannot reach the collector layer 13 is increased. In a similar way, such a reflection also occurs due to $\Delta\epsilon_{BC}$ when the electrons are injected from the base region 12 to the collector region 13. That is, at the interface between the semiconductor emitter and the metal base, and between the metal base and the semiconductor collector, the reflection factor $\tau$ is large and the transportation factor t is small, due to the large energy difference, as is well known in the field of quantum mechanics. From the above, it will be understood that, to increase the current gain $\alpha_0$, the base material having a relatively small $\Delta\epsilon_{EB}$ and small $\Delta\epsilon_{BC}$ must be chosen.

Another reason is that, because the density of electrons in the metal layer is large, many electrons $e^{31}$ running through the base layer 2 are scattered by the electrons ($-10^{22}cm^-$) in the metal. Therefore, a considerable number of electrons cannot reach the collector layer 13. From the above, it will be understood that the density of electrons in the base layer 12 must be relatively small.

Figure 3A:
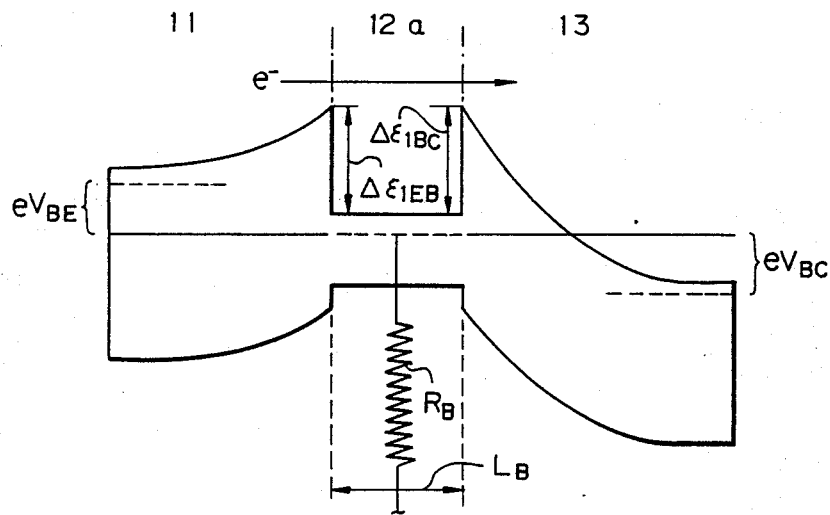
FIGS. 3(A) and 3(B)
Figure 3B:
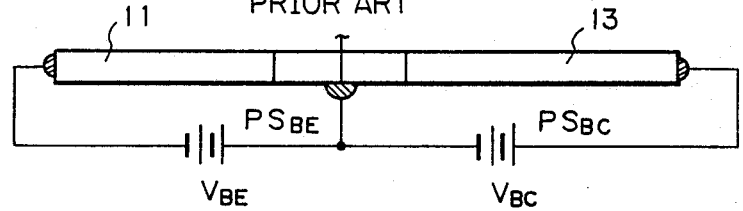

FIG. 3 is an energy-band diagram when a base-emitter voltage $V_{BE}$ and the base-collector voltage $V_{BC}$ are applied to an HET. Note, the same symbols as used in FIGS. 2 and 3 represent the same parts or have the same meaning; 12a in FIG. 3 is a high density n-type semiconductor base layer.

In the figure, $R_B$ is a base resistance, and $\Delta\epsilon_{1EB}$ and $\Delta\epsilon_{1BC}$ represent the potential differences affected when the electrons are injected from the emitter to the base and from the base to the collector, respectively.

In the HET, to operate at a high frequency, the base resistance $R_B$ is preferably as small as possible.

This is understood from the following expressions of the maximum oscillating frequency $f_{max}$ in a bipolar transistor:

$$f_{max} = \frac{1}{2}\left(\frac{f_T}{2\pi\gamma_B C_C}\right)^{\frac{1}{2}}$$

where, $f_T = \frac{1}{2\pi\tau_{ec}}$ $\tau_{ec} = \tau_E + \tau_C + \tau C$,
$\tau_B$: base resistance
$C_C$: collector capacitance
$f_T$: cut-off frequency:
$\tau_{ec}$: emitter-collector delay time
$\tau_E$: emitter depletion layer charging time
$\tau_B$: base charging time
$\tau_C$: collector depletion layer charging time, and
$\tau_C'$: collector charging time.

To lower the base resistance $R_B$, the base length $L_B$ of the base layer 12a can be made as long as possible to increase the cross sectional area of the base layer. But if the base length $L_B$ is increased, the cut-off frequency is lowered, and thus the maximum oscillation frequency $f_{max}$ is lowered. Therefore, to lower the base resistance $R_B$ and to make the base length $L_B$ thin are contradictory requirements.

Further, to maintain the property of the HET, the doping of the n-type impurity into the semiconductor base layer 12a has a limit of, for example, about $10^{18}$ to $10^{19} cm^{-3}$, and therefore, the base region $R_B$ cannot be made lower than a certain value.

Japanese Unexamined Patent Publication No. 62-45064, discloses a four terminal semiconductor element. This semiconductor element comprises heterojunctions of at least a first semiconductor layer (InAs layer) and a second semiconductor layer (GaSb) having a valence band edge Ev higher than the conduction band edge Ec of the first semiconductor layer. A first voltage is applied in the direction of the heterojunctions, while a second voltage is applied in a direction parallel to the heterojunctions, so that the first and the second semiconductor layers become a semi-metal layer.

Figure 4:
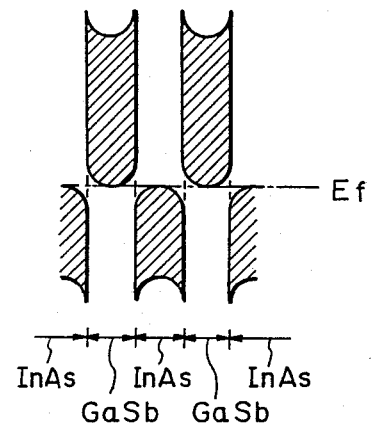
FIG. 4 is an energy-band diagram of a conventional InAs-GaSb superlattice in a semiconductor state.
Figure 5:
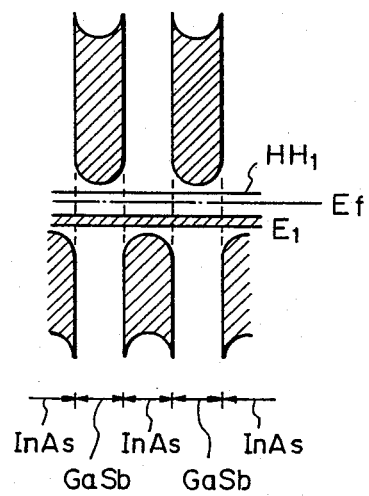
FIG. 5 is an energy-band diagram of conventional InAs-GaSb superlattice in a semi-metal state.

FIGS. 4 and 5 are band diagrams of InAs-GaSb superlattices in a semiconductor state and semi-metal state respectively, of the above-mentioned prior art.

In the prior art, however, to enable a switching operation, the thickness of the InAs layer and the GaSb layer must be as thick as 300 Å to 500 Å, and therefore, the semi-metal state is not realized unless the second voltage is not applied in a direction parallel to the heterojunctions.

Second, the above-mentioned semiconductor element has four terminals, two of which are used for the bias voltage applied in the vertical direction of the heterojunctions and the other two of which are used for the signal voltage applied in a direction horizontal to of the heterojunctions. Therefore, this element is not a transistor but a switching element.

Third, in the semi-metal state of the above prior art element, a current always flows through the subband (miniband) $E_1$ for electrons and through the energy level $HE_1$ for holes. Therefore, in the semi-metal state, the switching operation will not occur.

Figure 6:
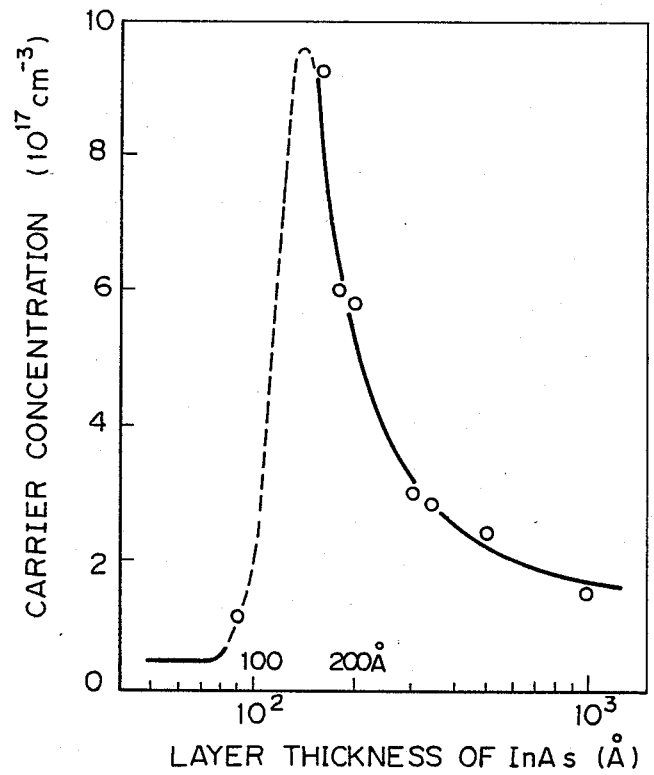
FIG. 6 is a graph of the relationship between carrier concentrations and layer thickness to demonstrate the semiconductor semi-metal transition.

FIG. 6 is a graph illustrating the experimental relationship between carrier concentrations and layer thickness, to demonstrate the semiconductor-semimetal transition region disclosed in App. Phys. Lett. 35 (12), Dec. 15, 1979, pp 939 to 942.

As shown in the graph, when the thickness of the InAs layer is between 100 Å and 200 Å, the carrier concentration is greatly increased so that a semi-conductor-semi-metal transition occurs.

In view of the above-described prior art with reference to FIGS. 1 to 6, the present invention will provide a three-terminal semiconductor device with a semi-metal base having a small energy difference $\Delta \epsilon_{EB}$ between the bottoms of the conduction bands of the emitter and the base, having a smaller energy difference $\Delta \epsilon_{BC}$ between the bottoms of the conduction bands of the base and the collector than the MBT, and having a smaller base resistance $R_B$ than the HET.

In the present invention, the basic concept is that the base layer is constructed by a semi-metallic material or a heterojunction is produced by using a specific semiconductor material in the base layer. Thus a semi-metal base transistor (SMBT) is realized by utilizing the semimetallic characteristics at the boundary surface.

As is well known, in a semi-metal, both the electrons and holes are present without the provision of an energy band gap. That is, when the top of the conduction band in a semiconductor layer is lower than the bottom of the valence band of the adjacent semiconductor layer, a semi-metal state is realized. Semi-metal material for constructing the above-mentioned base region can be, for example $Hg_{1-x}Cd_xTe$. In this case, by selecting the value X to be for example x=0.14 and the temperature to be, for example, 77K, a suitable condition for the semiconductor device of the present invention can be realized.

Also, when the semi-metal characteristic is utilized in the aforementioned heteroboundary surface, it is sufficient to select the conditions explained as follows.

Figure 7A:
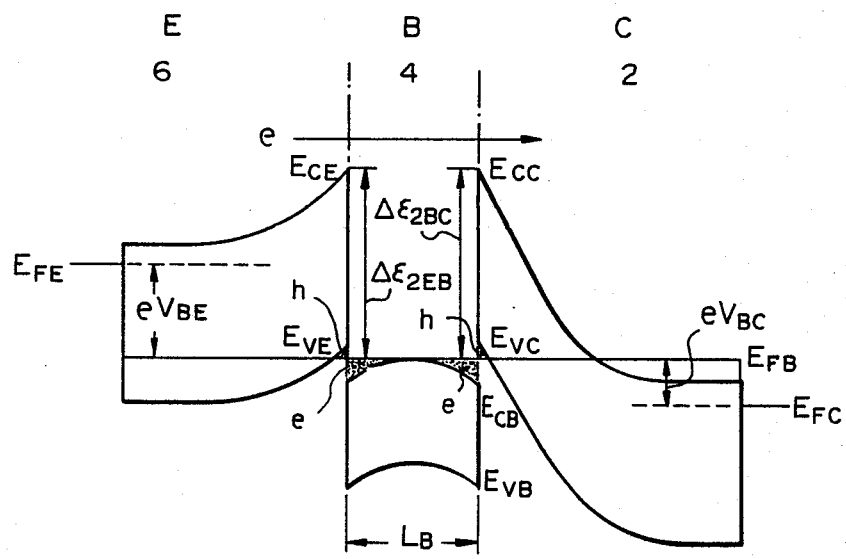
FIGS. 7(A) and 7(B)
Figure 7B:
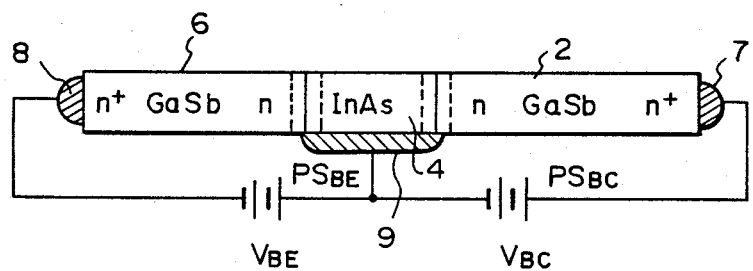

FIG. 7 is an energy band diagram of a semiconductor device according to an embodiment when bias voltages $V_{BE}$ and $V_{BC}$ are applied to the semiconductor device the semiconductor device is an SMBT utilizing the semi-metallic characteristic near the boundary of the heterojunction generated by utilizing a specific semiconductor material in the base region. The same symbols as the symbols used in FIG. 1 to 3 represent the same parts or have the same meaning; for simplicity, the band diagram in FIG. 7 shows a state at the absolute temperature of zero degrees.

In FIG. 7, 2 is a collector layer, 4 a base layer, 6 an emitter layer, 7 a collector electrode in ohmic contact with the collector layer 2, 8 an emitter electrode in ohmic contact with the emitter layer 6, and 9 a base electrode in ohmic contact with at least the base layer 4, e the electrons, h holes, $\Delta \epsilon_{2EB}$ an energy difference between the bottoms of the conduction bands of the emitter and the base layers, and $\Delta \epsilon_{2BC}$ an energy difference between the bottoms of the conduction bands of the base and the collector layers, respectively. $E_{FC}$, $E_{FB}$ and $E_{FE}$ represent Fermi levels of the collector, base and emitter layers, respectively.

As can be seen in the figure, when the heterojunctions are assembled, and when the relationship among the energy band gap $E_g$, the electron affinity X, and the work function $\phi$ are:

$$\phi_2 < \phi_1$$

where,
- $E_{g2}$: is the energy band gap of the semiconductor used in the emitter (or the collector) region 6 or 7;
- $X_1$: is the electron affinity of the semiconductor used in the base region 4;
- $X_2$: is the electron affinity of the semiconductor used in the emitter (or the collector) region 6 or 7; then, a semi-metallic characteristic is realized at least the boundary surfaces of the heterojunctions, the energy difference $\Delta \epsilon_{2EB}$ between the conduction band edges of the emitter and the base and the energy difference $\Delta \epsilon_{2BC}$ between the conduction band edges of the base and the collector can be made smaller than the $\Delta \epsilon_{EB}$ and the $\Delta \epsilon_{BC}$ in the MBT, and the base resistance $R_B$ can be made smaller than in the conventional case utilizing semiconductor as a base layer.

In other words, when the energy level $E_{CB}$ of the conduction band edge of the base layer 4 is lower than the energy level $E_{VE}$ of the valence band edge of the collector or emitter layer 2 or 6, a semi-metal layer is formed at least at the boundary region between the base and the collector or between the base and the emitter, as illustrated in FIG. 7 by dash lines.

The reduced resistance $R_B$ is obtained not only by the semi-metal base but also by the electrons e in the conduction band and the holes h is the valence band. Preferably the base electrode 9 is in contact with the full side surface of the base layer 4 and a part of the emitter layer 6 and the collector layer 2 at the vicinity of the interfaces to obtain a large reduction of the base resistance. This is also necessary conduct the electrons and holes.

The semiconductor device shown in FIG. 7 is a three-terminal element structure, i.e., the collector electrode 7, the emitter electrode 8, and the base electrode 9. The base layer 4 and the vicinity of the interfaces form a semi-metal base region.

During operation of the transistor shown in FIG. 7, when $V_{BE}$ is applied between the base and the emitter the barrier between the emitter and the base is lowered so that the electrons (which are carriers in the emitter region) having an energy higher than $E_{CE}$, are injected into the base region. The electrons injected into the base region are transferred as hot electrons to the collector region.

By employing the above-mentioned structure, a semiconductor device having a high switching speed, a smaller energy difference $\Delta\epsilon$ than an MBT, and a smaller base resistance $R_B$ than an HBT can be realized.

The small energy difference $\Delta\epsilon$ results in a small reflection factor in quantum mechanics at the boundary surface of the heterojunctions.

The collector layer 2, the base layer 4, and the emitter layer 6 are, preferably, GaSb, InAs, and GaSb, respectively.

Figure 8:
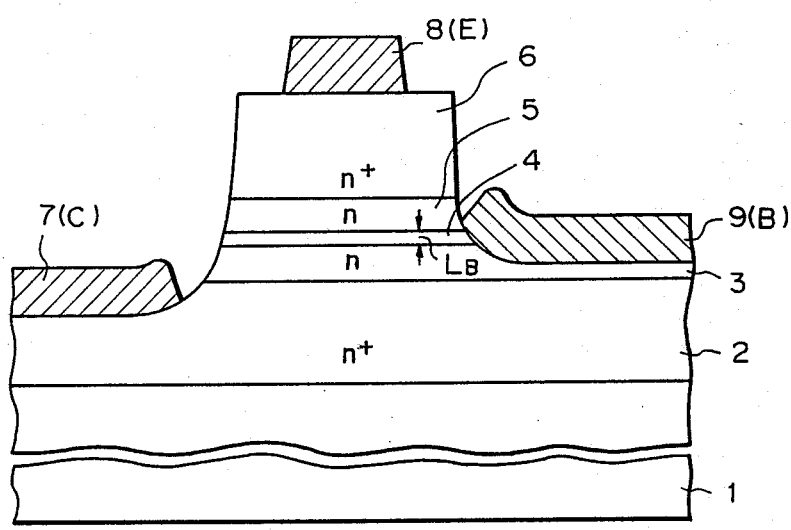
FIGS. 8 to 12 are main-portion cut side views of the semiconductor device during the main manufacturing processes, for explaining the manufacture of an embodiment of the present invention.

FIG. 8 is a main-portion of a side view of an embodiment of the semiconductor device described with reference to FIG. 7 in which the semimetallic characteristic at the heterojunction generated by a specific material is utilized.

In FIG. 8, 1 represents a semi-insulating GaAs substrate, 2 an n+-type GaSb collector layer, 3 an n-type GaSb collector barrier layer, 4 an n+-type InAs base layer, 5 an n-type GaSb emitter layer, 6 an n+-type GaSb emitter layer, 7 a collector electrode, 8 an emitter electrode, and 9 a base electrode, respectively.

The main data relating to each portion in the embodiment shown in FIG. 8 are expressed as an example in the following.

(a) For the collector layer 2:
  Thickness: 5000 Å, where (and hereinafter) 1 Å is $1 \times 10^{-8}$ cm;
  n-type impurity; Te
  Density of the impurity: $2 \times 10^{18}$ cm$^{-3}$
(b) For the collector barrier layer 3:
  Thickness: 500 Å
  n-type impurity: Te or nondoped
  Density of the impurity: $6 \times 10^{16}$ cm$^{-3}$
(c) For the base layer 4:
  Thickness: 150 Å
  The thickness of the base layer 4 may be between 100 Å and 200 Å
  n-type impurity: Si
  Density of the impurity: $1 \times 10^{19}$ cm$^{-3}$
(d) For the emitter barrier layer 5:
  Thickness: 150 Å
  n-type impurity: Te or nondoped
  Density of the impurity: $6 \times 10^{16}$ cm$^{-3}$
(e) For the emitter layer 6:
  Thickness: 5000 Å
  n-type impurity: Te
  Density of the impurity: $2 \times 10^{18}$ cm$^{-3}$
(f) For the collector electrode 7:
  Material: Au.Te
  Thickness: 1000 Å

(g) For the emitter electrode 8
  Material: Au.Te
  Thickness: 1000 Å
(h) For the base electrode 9
  Material: Au
  Thickness: 1000 Å

In the SMBT, the boundary surface, i.e., the interface between the collector barrier layer 3 and the base layer 4 and the boundary surface or the interface between the base layer 4 and the emitter barrier layer 5, form heterojunctions and represent semi-metallic characteristics. Therefore, the $\Delta\epsilon_{2EB}$ and the $\Delta\epsilon_{2BC}$ are small and the base resistance $R_B$ is low.

Note that the base electrode 9 is in ohmic contact with the side surface of the base layer 4 and with at least a part of the side surfaces of the emitter barrier layer 4 and the collector barrier layer 3, at a portion in the vicinity of the interface between the emitter barrier layer 5 and the base layer 4 and between the collector barrier layer 3 and the base layer 4.

FIGS. 9 to 12 are main-portion of side views for explaining the main process of manufacturing the embodiment shown in FIG. 8. The following explanation is given with reference to FIGS. 8 to 12.

Figure 9:
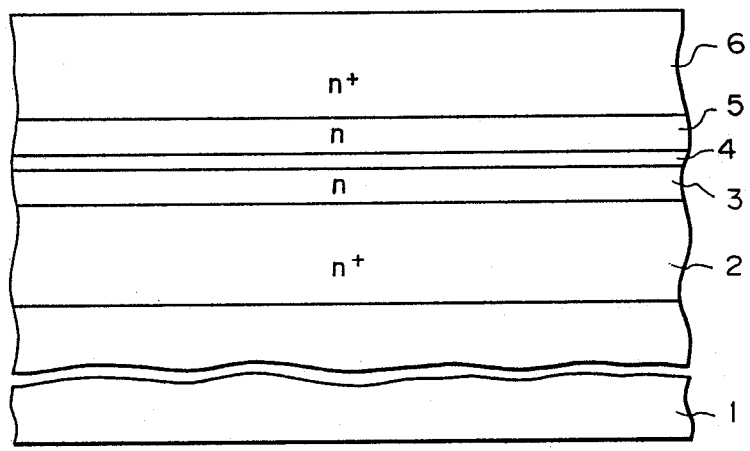

Referring to FIG. 9 by applying molecular beam epitaxy (MBE), layers from the collector layer 2 to the emitter layer 6 are continuously grown on the substrate 1.

The various data for each semiconductor layer in this case are as described hereinabove.

Figure 10:
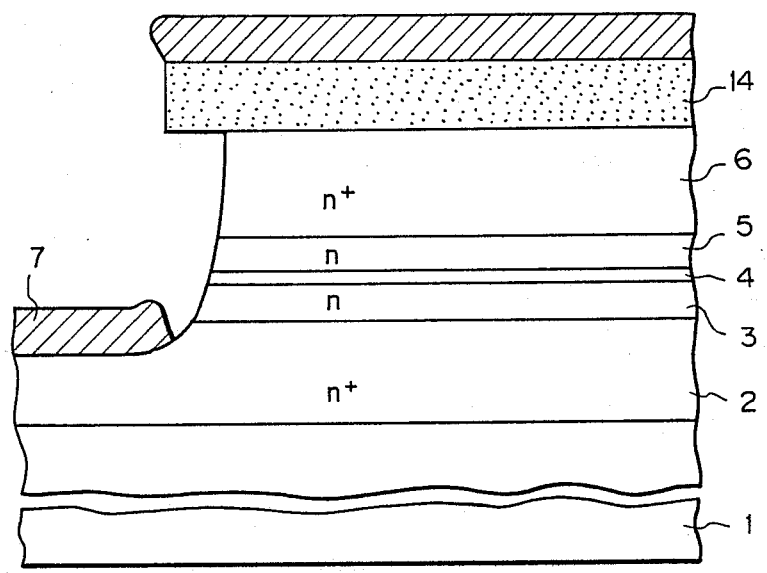

Referring to FIG. 10, by applying a resist process in a usual photo-lithography technique, a photo resist film 14 is formed to cover the portion except for the portion for forming the collector region. Then, by using the film 14 as a mask and by applying a wet etching method, etching is carried out from the surface of the emitter layer 6 to the collector layer 2, to selectively expose a part of the collector layer 2. Note that an etchant such as Br$_2$CH$_3$OH may be employed.

By applying a vacuum evaporation method under the conditions in which the photo-resist film 14 is kept as it is, an Au.Te film is formed a lift-off method for removing the photo-resist film 14, the collector electrode 7 is formed. Note that the figure shows the state in which the lift-off method has not been carried out.

Figure 11:
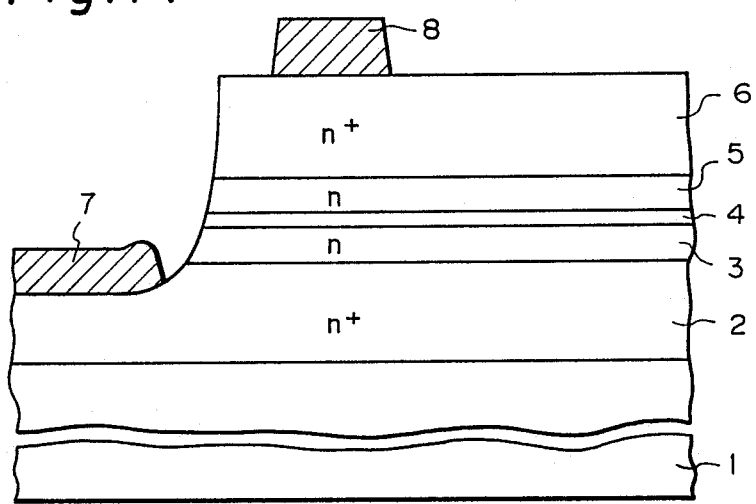

Referring to FIG. 11, by applying a resist process in a usual photo-lithography technique, a photo resist film is formed to cover the portion except for the portion for forming the emitter region. Then, by applying a vacuum evaporation method, an Au.Te film is formed. By lift-off method for removing the photo-resist film, the emitter electrode 8 is formed.

By applying a laser annealing method, the collector electrode 7 and the emitter electrode 8 are alloyed.

Figure 12:
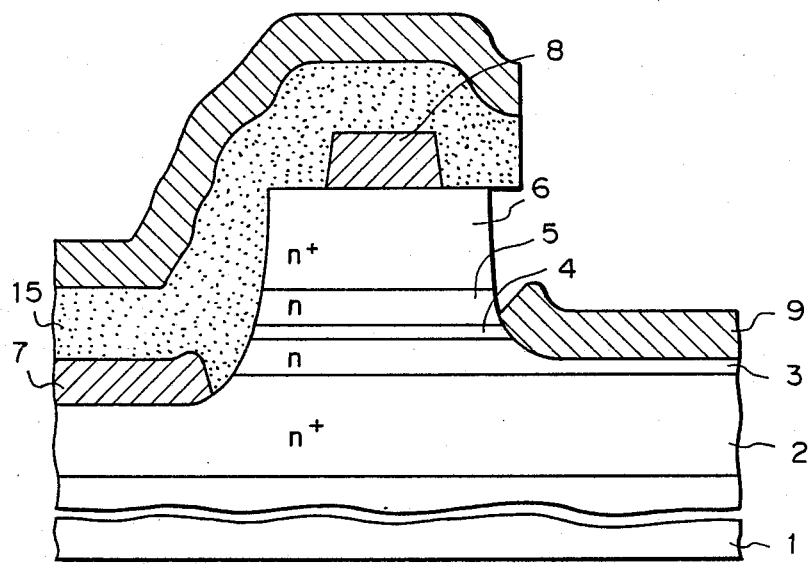

Referring to FIGS. 12 and 8.

By applying a resist process in a usual photo-lithography technique, a photo resist film 15 is formed to cover a portion except for the portion for forming the base region. Then, by applying a vacuum evaporation method, an Au film is formed. By employing a lift-off method for removing the photo-resist film 15 the base electrode 9 is formed. Note that the base electrode 9 made of Au can be brought into ohmic contact with the n+-type InAs base layer 4 without carrying out the annealing for alloying. Also, since Schottky barrier contacts are provided for the n-type GaSb collector barrier layer 3 or the n-type GaSb emitter barrier layer 5, leakage to the collector layer 2 or to the emitter layer 6 is automatically prevented. Note that the base electrode 9 made of Au is in ohmic contact with the holes generated at the junction surface of the GaSb side.

Figure 13:
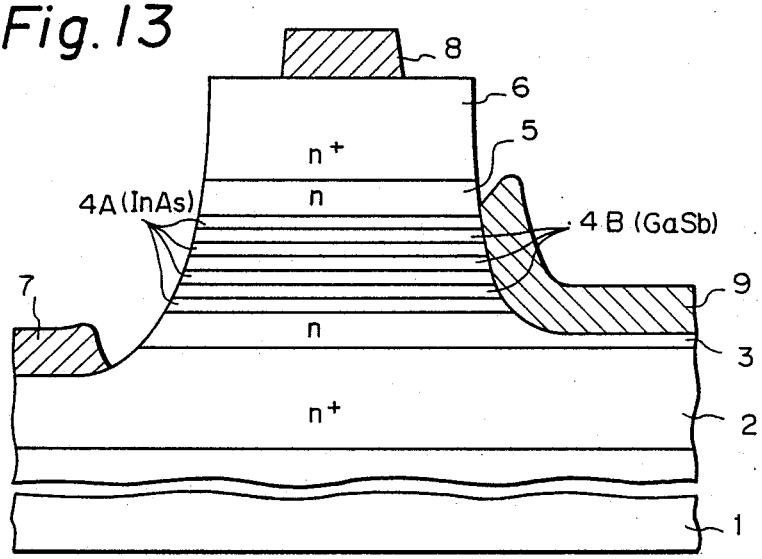
FIG. 13 is a main-portion cut side view of a semiconductor device for explaining another embodiment of the present invention.

FIG. 13 is a side view of another embodiment of the present invention, in which the same symbols as used in FIGS. 8 to 12 represent the same parts or have the same meaning.

The difference between the present embodiment and the embodiment described with reference to FIGS. 8 to 12 is that, in place of the n+-type InAs base layer 4, a superlattice consisting of n+-type InAs films 4A and n-type GaSb films 4B is employed. In this case, it is obvious that the, semi-metallic state is realized at each boundary surface of the InAs films 4A and the GaSb films 4B.

The main data in the above-described superlattice are, for example as follows.
(1) For the InAs film 4A.
 Thickness: 150 Å, the thickness may be between 100 Å and 200 Å
 n-type impurity: Si
 Concentration of impurity: $1 \times 10^{19}$ cm$^{-3}$
 Number of films: 4
(2) For the GaSb film 4B.
 Thickness: 100 Å, the thickness may be between 100 Å and 200 Å
 n-type impurity: Te
 Concentration of impurity: $6 \times 10^{16}$ cm$^{-3}$
 Number of films: 3

Figure 14A:
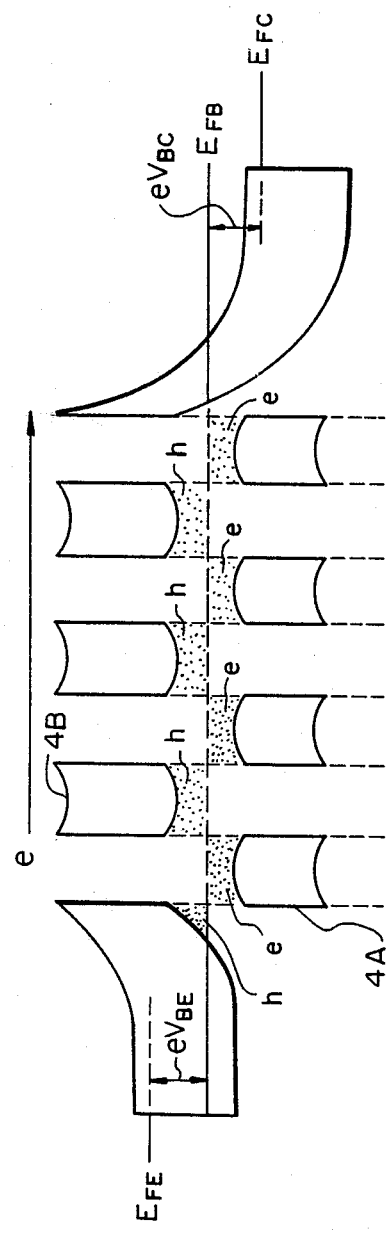
FIGS. 14(A) and 14(B)
Figure 14B:
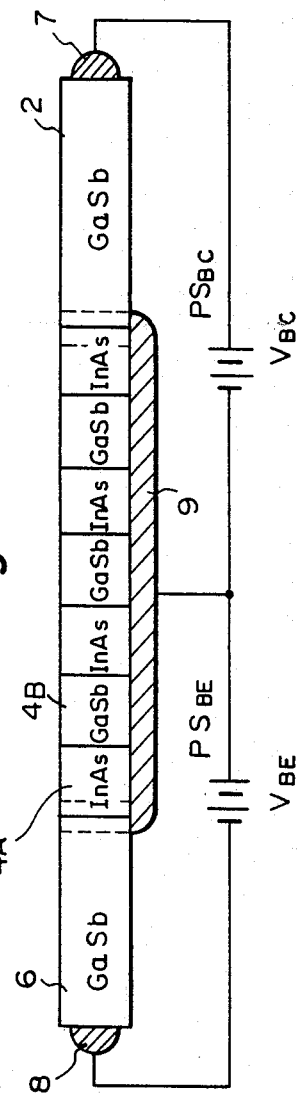

FIG. 14 is an energy-band diagram when bias voltages $V_{BE}$ and $V_{BC}$ are applied to the embodiment shown in FIG. 13, wherein the same symbols as used in FIG. 13 or in FIG. 7 represent the same parts or have the same meaning.

As can be seen from FIG. 14, holes occupy mainly the area between the valence band edge of each GaSb layer and the Fermi level $E_{FB}$ of the base region, and electrons mainly occupy the area between the Fermi level $E_{FB}$ and the conductor band edge of each InAs layer, resulting in a reduced base resistance. Electrons injected from the emitter layer 6 are passed as hot carriers through the base layer consisting of the barriers of GaSb-InAs at the emitter side and at the collector side and the InAs-GaSb alternating layers, to the collector layer 2.

Figure 15:
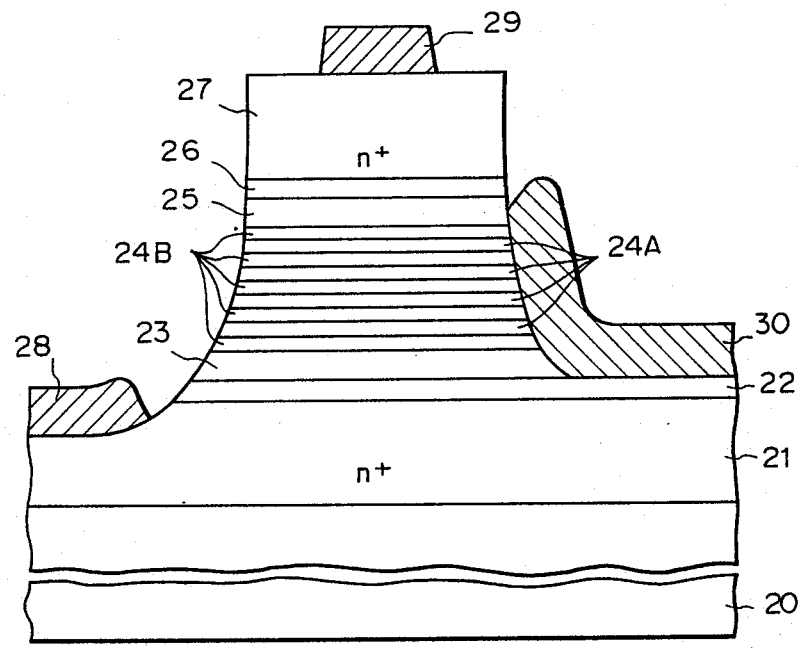
FIG. 15 is a main-portion cut side view of a semiconductor device for explaining still another embodiment of the present invention.

FIG. 15 is a side view of still another embodiment of the present invention, wherein the same symbols as used in FIGS. 8 to 14 represent the same parts or have the same meaning.

In FIG. 15, 20 represents an InP substrate, 21 an n+-type InGaAs collector layer, 22 an i-type Al$_x$In$_{1-x}$As barrier layer, 23 an In$_x$Ga$_{1-x}$As graded layer, 24B is a GaSb film, 25 is an In$_x$Ga$_{1-x}$As graded layer, 26 an i-type AlInAs barrier layer, 27 an n+-type InGaAs layer, 28 a collector electrode, 29 an emitter electrode, and 30 a base electrode, respectively.

The main data for each part in the present embodiment are exemplified as follows.
(a) For the collector layer 21
 Thickness: 5000 Å
 n-type impurity: Si
 Density of impurity: $1 \times 10^{19}$ cm$^{-3}$
(b) For the barrier layer 22
 Thickness: 200 Å
(c) For the graded layer 23
 Value x: 0.47→1.0 (substrate→surface side)
(d) For the InAs film 24A
 Thickness: 180 Å, the thickness may be between 100 Å and 200 Å
 n-type impurity: Si
 Density of impurity: $1 \times 10^{19}$ cm$^{-3}$
 Number of layers: 4
(e) For the GaSb film 24B
 Thickness: 180 Å, the thickness may be between 100 Å and 200 Å
 Number of layers: 5
(f) For the graded layer 25
 Thickness: 300 Å
 Value of x: 1.0→0.47 (GaSb side→AlInAs side)
(g) For the barrier layer 26
 Thickness: 200 Å
(h) For the emitter layer 27
 Thickness: 5000 Å
 n-type impurity: Si
 Density of impurity: $1 \times 10^{19}$ cm$^{-3}$
(i) For the collector electrode 28
 Material: Ni.Au
 Thickness: 1000 Å
(j) For the base electrode 30
 Material: Au
 Thickness: 1000 Å

In this embodiment also, it is obvious that a semi-metallic state is realized at each, hetero-boundary surface as in the embodiment described with reference to FIGS. 13 and 14. In addition, a tunnel barrier structure from the emitter layer 27 to the collector layer 21 is realized, as shown in FIG. 16.

Figure 16A:
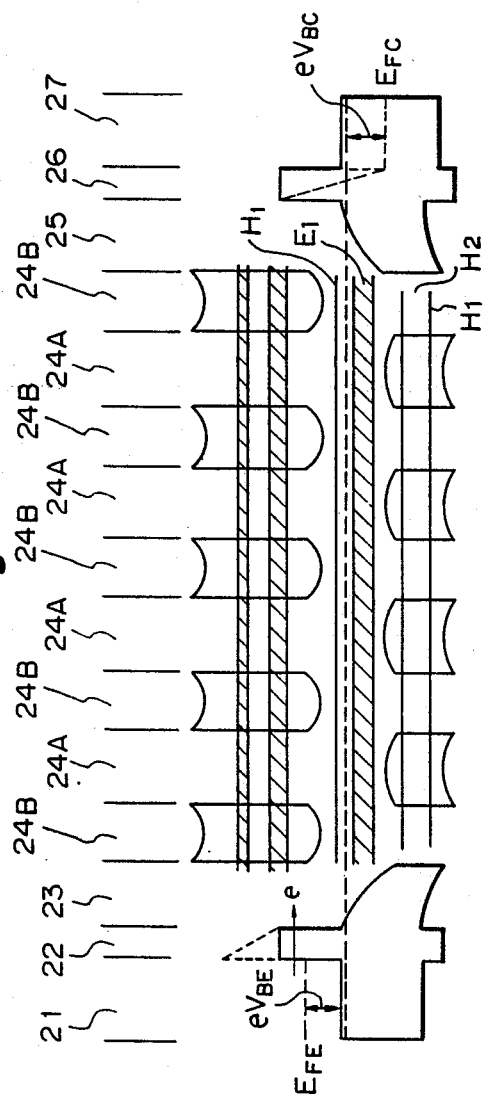
FIGS. 16(A) and 16(B)
Figure 16B:
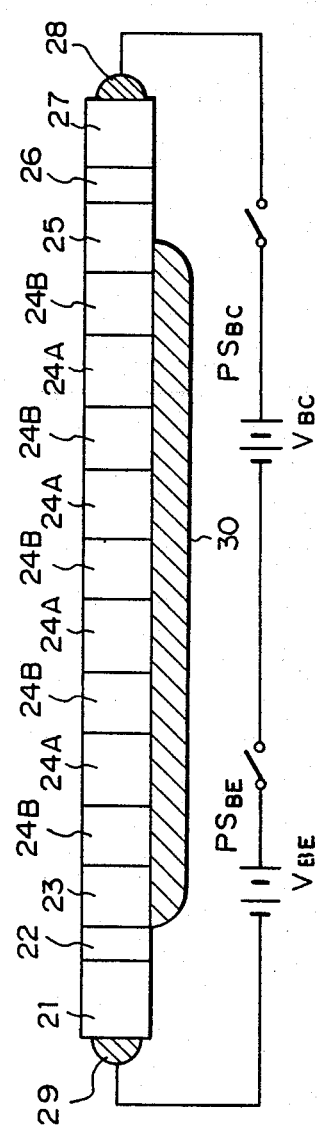

FIG. 16 is an energy-band diagram of the embodiment shown in FIG. 15, wherein the same symbols as used in FIGS. 8 to 15 represent the same parts or have the same meaning. Note that the solid lines in the regions 22 and 26 show the potentials thereof when bias voltages are not applied.

In FIG. 16, $E_1$, $E_2$ and $E_3$ represent the electron-resonance levels, and $H_1$, $H_2$ and $H_3$ represent the hole-resonance levels, respectively. The energy levels $E_1$, $E_2$, $E_3$, $H_1$, $H_2$, $H_3$ are referred to as minibands.

When the bias voltages $V_{BE}$ and $V_{BC}$ are not applied, the barrier layers 22 and 26 function as barriers for carriers. When the bias voltages are applied, the potentials at the barrier layers 22 and 26 are inclined so that carriers can pass therethrough by tunnelling. The carriers injected into the base layer having the InAs/GaSb/ . . . /GaSb/InAs superlattice structure are passed through the minibands.

Figure 17:
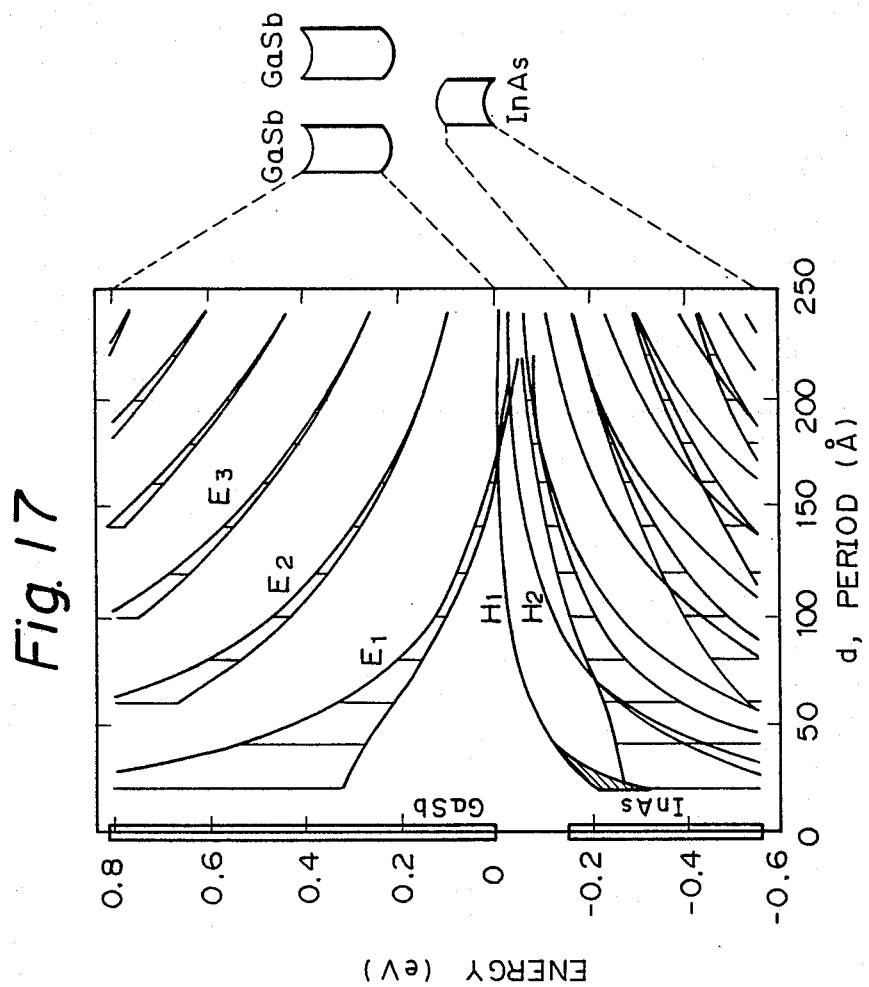
FIG. 17 is an energy band of minibands in the embodiment shown in FIG. 15.

FIG. 17 is a graph of the miniband energies calculated by G. A. Sai-Halasz, L. Esaki and W. A. Harrison, Phys. Rev. B18 p. 2812, 1978, wherein the same symbols as used in FIG. 16 represent the same parts or have the same meaning.

In the figure, the abscissa represents the period of the superlattice and the ordinate represents the energy. It is apparent that the energies in the minibands are a function of the period d of the superlattice.

In the present embodiment shown in FIGS. 15 and 16, a collector current flows when the injection energy of the electrons coincides with a miniband which is generated in accordance with the periodic structure of the superlattice. Therefore, a negative resistance is obtained due to the base-emitter voltage $V_{BE}$.

Figure 18:
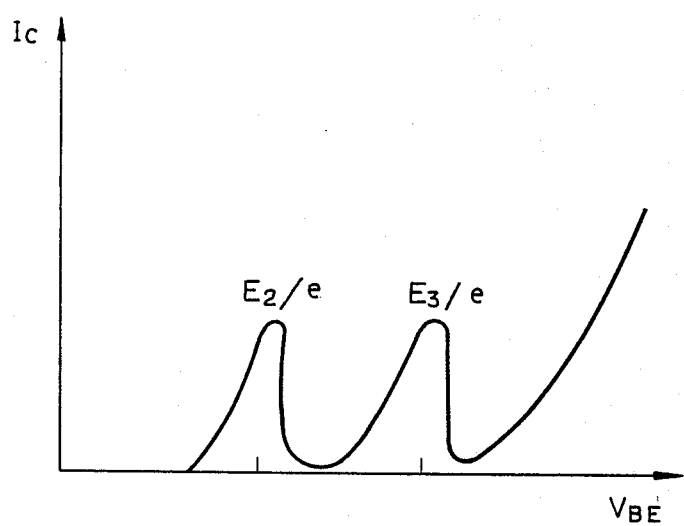
FIG. 18 is a graph for explaining the negative resistance of the embodiment shown in FIG. 15.

FIG. 18 is a graph of the negative resistance in the embodiment described with reference to FIGS. 15 to 17, wherein the horizontal axis represents the base-emitter voltage $V_{BE}$ and the ordinate represents the collector current $I_C$. The same symbols as used in FIGS. 16 and 17 represent the same parts or have the same meaning. In FIG. 18, the peak for the mini-electron band $E_1$ does not appear. This is because the mini electron band $E_1$ under a state in which the voltage is 0 is lower than the Fermi level of the emitter side. Note that, when the base emitter voltage $V_{BE}$ is negative peaks will appear.

In the semiconductor device according to the present invention, a three-terminal structure having a base region of semi-metal is provided.

By adopting the afore-mentioned structure, a semiconductor device having a high switching speed and a smaller $\Delta\epsilon_{EB}$ and $\Delta\epsilon_{BC}$ than the MBT and a smaller base resistance $R_B$ than the HET, can be realized.

I claim:

1. A semiconductor device comprising:
   a first semiconductor layer;
   a second semiconductor layer;
   a third semiconductor layer sandwiched between said first and second semiconductor layers;
   a first electrode ohmically contacting said first semiconductor layer;
   a second electrode ohmically contacting said second semiconductor layer; and
   a third electrode ohmically contacting at least said third semiconductor layer;
   said first and second semiconductor layers having substantially the same conduction bands and substantially the same valence bands when a bias voltage is not applied thereto;
   at the interface between said first and third semiconductor layers and between said second and third semiconductor layers, the energy level of the conduction band edge of said third semiconductor layer being lower than the energy level of the valence band edge of one of said first and second semiconductor layers,
   said third semiconductor layer having a thickness such that at least at the interface between said first and third semiconductor layers and between said second and third semiconductor layers, a semimetal layer is formed.

2. A semiconductor device according to claim 1, wherein the interfaces between said first and third semiconductor layers and between said second and third semiconductor layers are heterojunctions.

3. A semiconductor device according to claim 1, wherein said first and second semiconductor layers comprise GaSb layers, and wherein said third semiconductor layer comprises an InAs layer, the thickness of said InAs layer being from 100 Å ($1 \times 10^{-6}$ cm) to 200 Å ($2 \times 10^{-6}$ cm).

4. A semiconductor device according to claim 1, wherein said third electrode ohmically contacting said first and second semiconductor layers with respect to carriers generated in said first and second semiconductor layers and at a portion in the vicinity of the interface between said first semiconductor layer and said third semiconductor layer and at a portion in the vicinity of the interface between said second semiconductor layer and said third semiconductor layer.

5. A semiconductor device comprising:
   a base layer having at least three layers including a GaSb/InAs/GaSb structure, outer layers in said GaSb/InAs/GaSb structure being GaSb layers, the InAs layer in said GaSb/InAs/GaSb structure having a thickness of between 100 Å ($10^{-6}$ cm) and 200 Å ($2 \times 10^{-6}$ cm), whereby said GaSb/InAs/GaSb structure has a characteristic of a semi-metal;
   an emitter layer provided on a first side of said GaSb/InAs/GaSb structure;
   a collector layer provided on a second side of said GaSb/InAs/GaSb structure opposite the first side;
   a base electrode ohmically contacting at least the InAs layer in said GaSb/InAs/GaSb structure of said base layer;
   an emitter electrode provided on and ohmically contacting said emitter layer; and
   a collector electrode provided on and ohmically contacting said collector layer;
   whereby, by applying a voltage between said emitter electrode and said base electrode, carriers injected from said emitter later pass through said base layer as hot carriers to said collector layer.

6. A semiconductor device according to claim 5, wherein said base electrode ohmically contacting all layers in said GaSb/InAs/GaSb structure.

7. A semiconductor device according to claim 5, wherein said emitter layer and said collector layer are GaSb layers.

8. A semiconductor device according to claim 5, wherein, at the interfaces between the GaSb layer and the InAs layer in said GaSb/InAs/GaSb structure, the conduction band edge of the InAs layer is lower than the valence band edge of the GaSb layer.

9. A semiconductor device according to claim 5, wherein the conductivity type of said GaSb/InAs/GaSb structure is n-n-n.

10. A semiconductor device according to claim 5, wherein the conductivity type of said GaSb/InAs/GaSb structure is p-p-p.

11. A semiconductor device according to claim 5, wherein said base layer comprises a plurality of periodic GaSb/InAs/GaSb structures forming a superlattice structure.

12. A semiconductor device comprising:
   a base layer having at least three layers including an InAs/GaSb/InAs structure, outer layers in said InAs/GaSb/InAs structure being InAs layers, each InAs layer in said InAs/GaSb/InAs structure having a thickness of between 100 Å ($10^{-6}$ cm) and 200 Å ($2 \times 10^{-6}$ cm), whereby said InAs/GaSb/InAs structure has a characteristic of a semimetal;
   an emitter layer provided on a first side of said InAs/GaSb/InAs structure;
   a collector layer provided on a second side of said InAs/GaSb/InAs structure the second side being opposite the first side;
   a first barrier layer provided between said base layer and said emitter layer, for preventing an injection of carriers from said emitter layer to said base layer when a bias voltage is not applied between said base layer and said emitter layer;
   a second barrier layer provided between said base layer and said collector layer, for preventing an injection of carriers from said collector layer to said base layer when a bias voltage is not applied between said base layer and said collector layer;
   a base electrode ohmically contacting at least the InAs layer in said InAs/GaSb/InAs structure of said base layer;
   an emitter electrode provided on ohmically contacting said emitter layer; and
   a collector electrode provided on and ohmically contacting said collector layer.

13. A semiconductor device according to claim 12, wherein said base electrode ohmically contacts all layers in said InAs/GaSb/InAs structure.

14. A semiconductor device according to claim 12, wherein said emitter layer and said collector layer are InAs layers.

15. A semiconductor device according to claim 12, wherein, at the interfaces between the GaSb layer and the InAs layer in said GaSb/InAs/GaSb structure, the conduction band edge of the InAs layer is lower than the valence band edge of the GaSb layer.

16. A semiconductor device according to claim 12, wherein the conductivity type of said InAs/GaSb/InAs structure is n-n-n.

17. A semiconductor device according to claim 12, wherein the conductivity type of said InAs/GaSb/InAs structure is p-p-p.

18. A semiconductor device according to claim 12, wherein said base layer has a plurality of periodic InAs/GaSb/InAs structures forming a superlattice structure.

19. A semiconductor device according to claim 12, wherein when a voltage is applied between said emitter electrode and said base electrode, carriers are injected from said emitter layer through said first barrier layer by tunneling to said base layer and are passed through minibands in said base layer.

20. A semiconductor device according to claim 12, wherein said first and second barrier layers are AlInAs layers.

21. A semiconductor device comprising:
a base layer having at least three layers, each of said three layers including a first semiconductor material, a second semiconductor material, and said first semiconductor material structure, outer layers in said structure being said first semiconductor material layers, said second semiconductor material layer in said structure having a thickness such that at least at the interfaces between said first and second semiconductor material layers, a semi-metal is formed, and at the interfaces between said first and second semiconductor material layers, the energy level of the conduction band edge of each said second semiconductor material layer is lower than the energy level of the valence band edge of each said first semiconductor material layer;
an emitter layer provided on a first side of said base layer structure;
a collector layer provided on a second side of said base layer structure; a base electrode ohmically contacting at least said second semiconductor material layer in said base layer structure;
an emitter electrode provided on and ohmically contacting said emitter layer;
a collector electrode provided on and ohmically contacting said emitter layer;
whereby, by applying a voltage between said emitter electrode and said base electrode, carriers injected from said emitter layer are passed through said base layer as hot carriers to said collector layer.

22. A semiconductor device comprising:
a base layer having at least three layers including;
a first layer of a second semiconductor material;
a second layer of a first semiconductor material formed on said first layer; and
a third layer of a second semiconductor material formed on said second layer;
outer layers in said structure being said second semiconductor material layers, said first semiconductor material layer in said structure having a thickness such that at least at the interfaces between said first and second semiconductor material layers, a semi-metal is formed, the energy level of the conduction band edge of each said first semiconductor material layer being lower than the energy level of the valence band edge of each said second semiconductor material layer;
an emitter layer provided on a first side of said structure;
a collector layer provided on a second side of said structure opposite the first side;
a first barrier layer provided between said base layer and said emitter layer, for preventing an injection of carriers from said emitter layer to said base layer when a bias voltage is not applied between said base layer and said emitter layer;
a second barrier layer provided between said base layer and said collector layer, for preventing an injection of carriers from said collector layer to said base layer when a bias voltage is not applied between said base layer and said collector layer;
a base electrode ohmically contacting at least the second semiconductor material layer in said structure;
an emitter electrode provided on and ohmically contacting said emitter layer; and a collector electrode provided on and ohmically contacting said collector layer.

* * * * *

UNITED STATES PATENT AND TRADEMARK OFFICE
CERTIFICATE OF CORRECTION

PATENT NO. : 4,916,495
DATED : APRIL 10, 1990
INVENTOR(S) : YUJI AWANO

It is certified that error appears in the above-identified patent and that said Letters Patent is hereby corrected as shown below:

Col. 1, line 59, "of" should be deleted.

Col. 4, line 23, "electrons $e^{31}$" should be --electrons $e^-$--;

line 26, "$(-10^{22}cm^-)$" should be --$(-10^{22}cm^{-3})$--.

Col. 5, line 33, "of" should be deleted.

Col. 7, line 5, "necessary conduct" should be --necessary to conduct--.

Col. 12, line 14, "later" should be --layer--.

Signed and Sealed this

Twenty-first Day of May, 1991

Attest:

HARRY F. MANBECK, JR.

Attesting Officer     Commissioner of Patents and Trademarks